United States Patent
Matsumura

(10) Patent No.: US 12,224,455 B2
(45) Date of Patent: Feb. 11, 2025

(54) IN-VEHICLE WIRING MODULE AND FLEXIBLE SUBSTRATE

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventor: Nobuyuki Matsumura, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 190 days.

(21) Appl. No.: 18/020,374

(22) PCT Filed: Jul. 28, 2021

(86) PCT No.: PCT/JP2021/027847
§ 371 (c)(1),
(2) Date: Feb. 8, 2023

(87) PCT Pub. No.: WO2022/044666
PCT Pub. Date: Mar. 3, 2022

(65) Prior Publication Data
US 2023/0307795 A1   Sep. 28, 2023

(30) Foreign Application Priority Data
Aug. 27, 2020 (JP) .................... 2020-143403

(51) Int. Cl.
*H01M 50/507* (2021.01)
*B60L 50/64* (2019.01)
(Continued)

(52) U.S. Cl.
CPC .......... *H01M 50/507* (2021.01); *B60L 50/64* (2019.02); *H01M 50/209* (2021.01); *H01M 50/553* (2021.01); *H01M 2220/20* (2013.01)

(58) Field of Classification Search
CPC ............. H01M 50/507; H01M 50/553; H01M 50/249; H01M 50/50; H01M 50/209;
(Continued)

(56) References Cited

U.S. PATENT DOCUMENTS

2010/0202119 A1* 8/2010 Nagami ............... H05K 1/0281
361/749
2012/0328920 A1  12/2012 Takase et al.
(Continued)

FOREIGN PATENT DOCUMENTS

JP  2001-326427  11/2001
JP  2011-210711  10/2011
(Continued)

OTHER PUBLICATIONS

International Search Report issued in International Bureau of WIPO Patent Application No. PCT/JP2021/027847, dated Oct. 19, 2021, along with an English translation thereof.

*Primary Examiner* — Timothy J Thompson
*Assistant Examiner* — Michael F McAllister
(74) *Attorney, Agent, or Firm* — Greenblum & Bernstein, P.L.C.

(57) ABSTRACT

Provided is an in-vehicle wiring module that is attached to a plurality of power storage elements that include electrode terminals, and includes a busbar that is connected to the electrode terminals, and a flexible substrate that is electrically connected to the busbar, the flexible substrate has a folded-over structures where the flexible substrate is folded along folding portions, the folded-over structure includes protrusions that protrude from outer edges of the flexible (Continued)

substrate in an expanded state before the flexible substrate is folded along the folding portions, and slits into which the protrusions are to be inserted, the folding portions are disposed between the protrusions and the slits of the flexible substrate in the expanded state, and, as a result of the protrusions being inserted into the slits, the flexible substrate is kept from deforming so as to return to the expanded state from a state of being folded along the folding portions.

6 Claims, 12 Drawing Sheets

(51) Int. Cl.
*H01M 50/209* (2021.01)
*H01M 50/553* (2021.01)
(58) Field of Classification Search
CPC ............. H01M 50/298; H01M 50/284; H01M 2220/20; B60L 50/64; H01G 2/06; H01G 4/38; H05K 1/02; Y02E 60/10
USPC .......................................................... 174/254
See application file for complete search history.

(56) References Cited

U.S. PATENT DOCUMENTS

| | | | |
|---|---|---|---|
| 2020/0020916 A1 | 1/2020 | Takamatsu et al. | |
| 2020/0020917 A1 | 1/2020 | Ichikawa et al. | |
| 2020/0020918 A1 | 1/2020 | Ichikawa et al. | |
| 2020/0021096 A1 | 1/2020 | Ichikawa et al. | |
| 2020/0022260 A1 | 1/2020 | Takamatsu et al. | |
| 2020/0396830 A1* | 12/2020 | Yasuda | H05K 1/189 |

FOREIGN PATENT DOCUMENTS

| | | |
|---|---|---|
| JP | 2019-021454 | 2/2019 |
| JP | 2020-014369 | 1/2020 |
| WO | 2009/037796 | 3/2009 |

\* cited by examiner

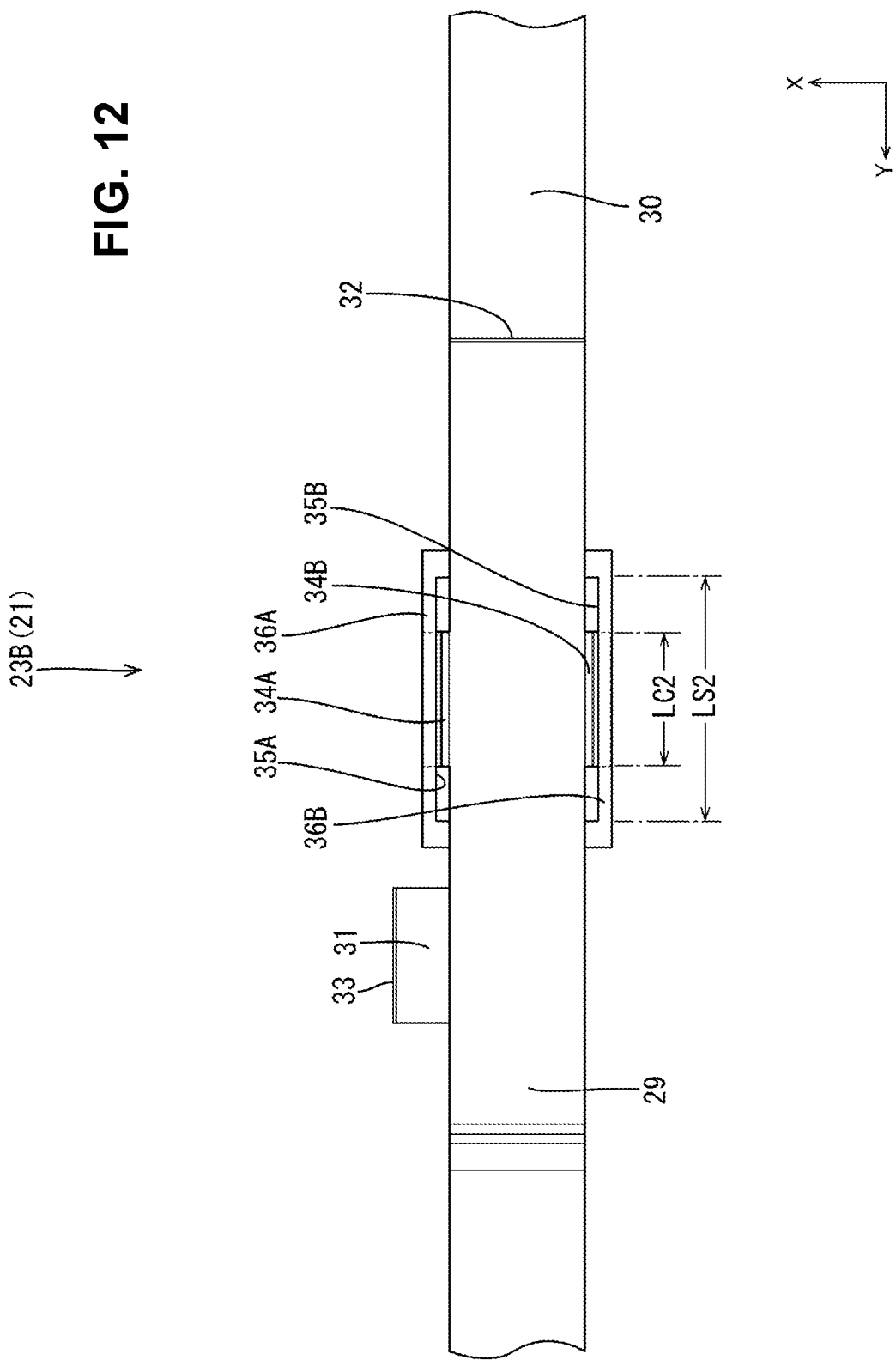

IN-VEHICLE WIRING MODULE AND FLEXIBLE SUBSTRATE

TECHNICAL FIELD

The present disclosure relates to an in-vehicle wiring module and a flexible substrate.

BACKGROUND ART

Heretofore, a busbar module described in JP 2020-14369A (Patent Document 1 below) is known as a busbar module that is attached to a battery aggregate mounted in an electric automobile, a hybrid automobile, or the like. The busbar module described in Patent Document 1 includes a busbar that is connected to electrodes of a plurality of unit batteries, and a flexible substrate that includes a wiring pattern that is connected to the busbar. The flexible substrate includes a main line, a first branch line portion that extends from the main line, and a second branch line portion that extends from the first branch line portion and includes a coupling portion for connection to the busbar. A first turn-back portion and a second turnback portion are provided on the second branch line portion, and the second branch line portion is curved in an S-shape overall. Accordingly, the second branch line portion is extendable, and it is possible to absorb manufacturing tolerance, assembly errors, and the like of the busbar and the unit batteries.

CITATION LIST

Patent Documents

Patent Document 1 JP 2020-14369A

SUMMARY OF INVENTION

Problems to be Solved by Invention

However, when a flexible substrate folded as described above is manufactured and transported to an assembly factory, there is a risk that the flexible substrate will deform and be unable to retain its original shape. In addition, depending on the manufacturing process, positioning of such a flexible substrate is difficult, and a case is conceivable where another member and the flexible substrate cannot be smoothly attached to each other.

Solution to Problem

An in-vehicle wiring module according to the present disclosure is an in-vehicle wiring module that is to be attached to a plurality of power storage elements that include electrode terminals, the in-vehicle wiring module including: a busbar that is connected to the electrode terminals, and a flexible substrate that is electrically connected to the busbar, the flexible substrate having a folded-over structure where the flexible substrate is folded along a folding portion, the folded-over structure including a protrusion that protrudes from an outer edge of the flexible substrate in an expanded state before the flexible substrate is folded along the folding portion, and a slit into which the protrusion is to be inserted, the folding portion being disposed between the protrusion and the slit of the flexible substrate in the expanded state, and, as a result of the protrusion being inserted into the slit, the flexible substrate being kept from deforming so as to return to the expanded state from a state of being folded along the folding portion.

Advantageous Effects of Invention

According to the present disclosure, it is possible to provide an in-vehicle wiring module that includes a flexible substrate that is less likely to deform in a folded state.

BRIEF DESCRIPTION OF DRAWINGS

FIG. 12 is a plan view of the second folded-over structure of the flexible substrate.

EMBODIMENTS OF INVENTION

Description of Embodiments of Disclosure

Figure 1:
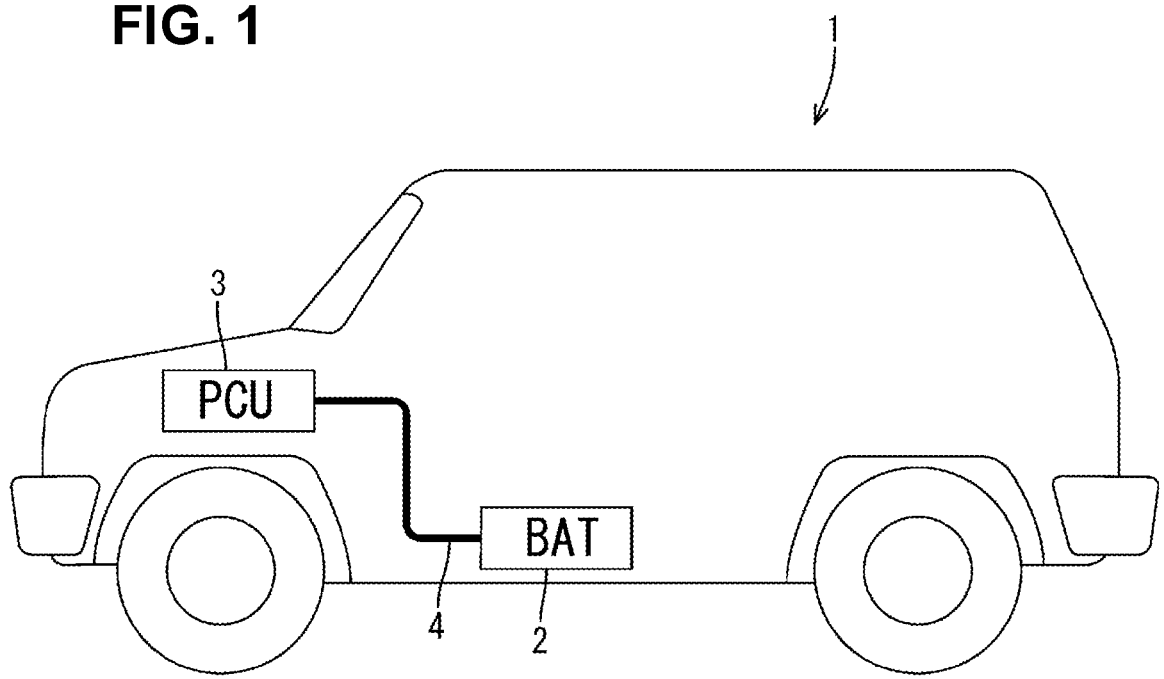
FIG. 1 is a schematic diagram showing a vehicle in which a power storage module according to an embodiment of the present invention is mounted.

First, embodiments of the present disclosure will be listed and described.

(1) An in-vehicle wiring module according to the present disclosure is an in-vehicle wiring module that is to be attached to a plurality of power storage elements that include electrode terminals, the in-vehicle wiring module including: a busbar that is connected to the electrode terminals, and a flexible substrate that is electrically connected to the busbar, the flexible substrate having a folded-over structure where the flexible substrate is folded along a folding portion, the folded-over structure including a protrusion that protrudes from an outer edge of the flexible substrate in an expanded state before the flexible substrate is folded along the folding portion, and a slit into which the protrusion is to be inserted, the folding portion being disposed between the protrusion and the slit of the flexible substrate in the expanded state, and, as a result of the protrusion being inserted into the slit, the flexible substrate being kept from deforming so as to return to the expanded state from a state of being folded along the folding portion.

According to this configuration, it is possible to keep the flexible substrate folded along the folding portion from deforming so as to return to the expanded state, and thus the flexible substrate can be easily attached to the in-vehicle wiring module.

(2) It is preferable that one folded-over structure is provided with a pair of protrusions and a pair of slits.

According to this configuration, it is possible to further effectively keep the flexible substrate folded along the folding portion from deforming so as to return to the expanded state.

(3) It is preferable that the flexible substrate has a shape that is elongated in a first direction, the folded-over structure includes a pair of length portions that extend in parallel in the first direction in the expanded state, a coupling portion for coupling the pair of length portions, and a pair of folding portions, the protrusions are provided on one of the pair of length portions, the slits are provided on the other, and creases of the pair of folding portions of the folded-over structure are disposed perpendicular to each other.

According to this configuration, the length in the first direction of the flexible substrate folded along the folding portion can be set larger than the length in the first direction of the flexible substrate in the expanded state. For this reason, for example, even when a large number of power storage elements are stacked in the first direction, the in-vehicle wiring module can be easily manufactured.

(4) It is preferable that the pair of length portions are disposed at the same position in a short-side direction of the flexible substrate that is orthogonal to the first direction, and are aligned on the same line extending in the first direction.

According to this configuration, the pair of length portions are aligned on the same line extending in the first direction, and thus the flexible substrate can be formed in an elongated shape. For this reason, it is possible to reduce the length of the in-vehicle wiring module in the short-side direction of the flexible substrate.

(5) It is preferable that the flexible substrate has a shape that is elongated in the first direction, the slit is formed to be elongated in the first direction, and a length in the first direction of the slit is set larger than a length in the first direction of the protrusion.

According to this configuration, the protrusion is slidable in the first direction in a state of being inserted into the slit, and thus it is possible to absorb manufacturing tolerance in the first direction of the power storage elements, the busbar, and the like and assembly tolerance between the in-vehicle wiring module and the plurality of power storage elements.

(6) In addition, a flexible substrate according to the present disclosure is a flexible substrate that is to be incorporated in an in-vehicle wiring module in a state of being folded along a folding portion, the flexible substrate including a protrusion that protrudes from an outer edge of the flexible substrate in an expanded state before the flexible substrate is folded along the folding portion, and a slit into which the protrusion is to be inserted, the folding portion being disposed between the protrusion and the slit in the expanded state, and, as a result of the protrusion being inserted into the slit, the flexible substrate being kept from deforming so as to return to the expanded state from the state of being folded along the folding portion.

According to this configuration, the flexible substrate folded along the folding portion can be kept from deforming so as to return to the expanded state, and thus the flexible substrate is less likely to deform during transportation or the like.

DETAILED DESCRIPTION OF EMBODIMENTS OF DISCLOSURE

Embodiments of the present disclosure will be described below. The present disclosure is not limited to illustrations of these, but is indicated by the claims, and all changes that come within the meaning and range of equivalency of the claims are intended to be embraced therein.

Embodiment

Embodiments according to the present disclosure will be described with reference to FIGS. 1 to 12. As shown in FIG. 1, a power storage module 10 according to the present embodiment is applied to a power storage pack 2 mounted in a vehicle 1, for example. The power storage pack 2 is mounted in the vehicle 1 such as an electric automobile or a hybrid automobile, and is used as a driving source of the vehicle 1. In the following description, reference numerals may be given to only some of a plurality of members, and reference numerals for the other members may be omitted.

As shown in FIG. 1, the power storage pack 2 is disposed in the vicinity of the center of the vehicle 1. A PCU 3 (Power Control Unit) is disposed on the front side of the vehicle 1. The power storage pack 2 and the PCU 3 are connected to each other by a wire harness 4. The power storage pack 2 and the wire harness 4 are connected to each other by a connector (not illustrated). The power storage pack 2 includes the power storage module 10 that includes a plurality of power storage elements 11. The power storage module 10 (and an in-vehicle wiring module 20) can be mounted in any orientation, but a description will be given below assuming that, except for FIG. 1, a direction indicated by a Z arrow represents an upward direction, a direction indicated by an X arrow represents a forward direction, and a direction indicated by a Y arrow represents a leftward direction. In addition, in the present embodiment, the first direction corresponds to the left-right direction.

Figure 2:
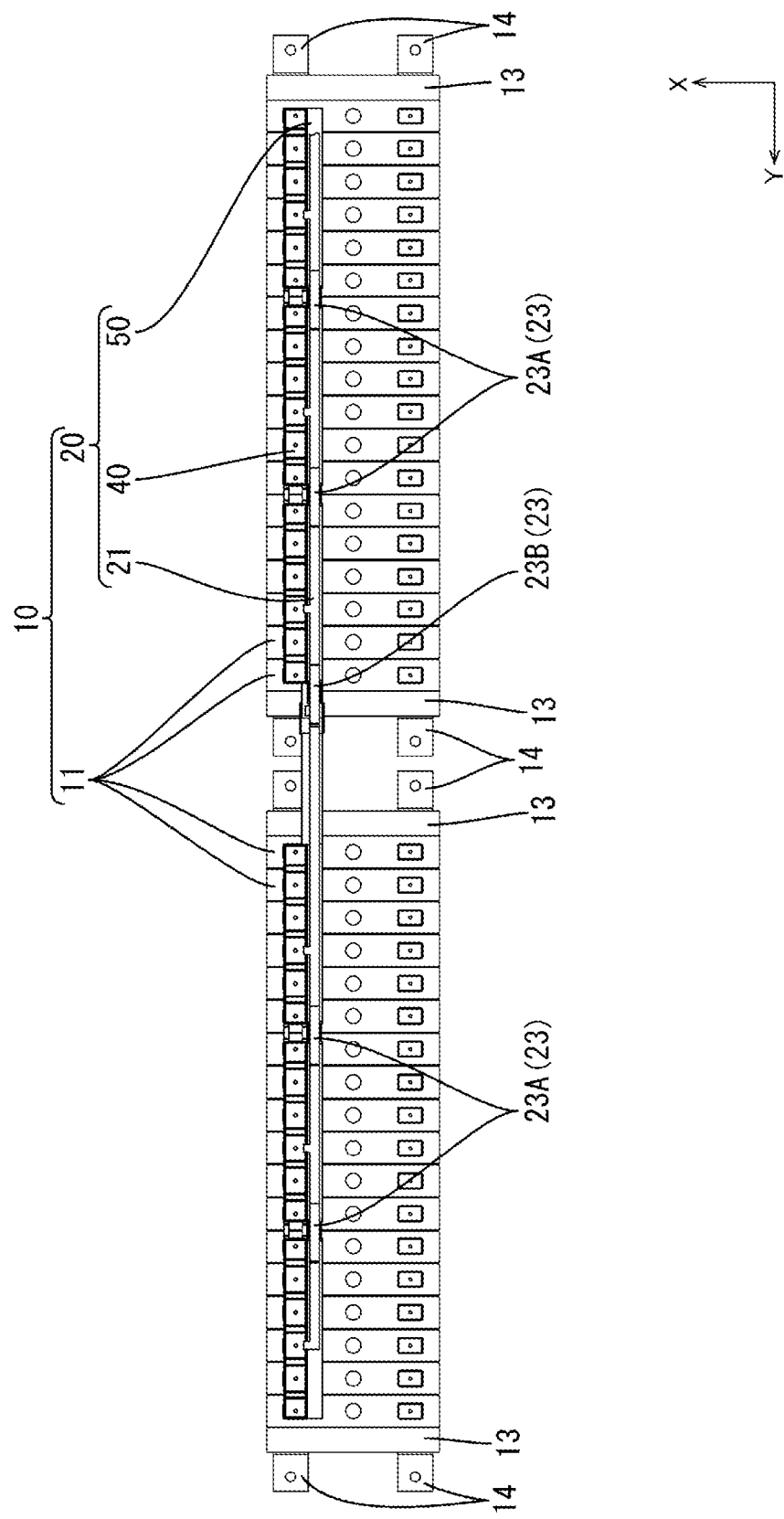
FIG. 2 is a plan view of the power storage module.

As shown in FIG. 2, the power storage module 10 includes a plurality of power storage elements 11 (in the present embodiment, 36 power storage elements 11) aligned in the left-right direction, and the in-vehicle wiring module 20 that is mounted on the upper surfaces of the plurality of power storage elements 11.

Figure 3:
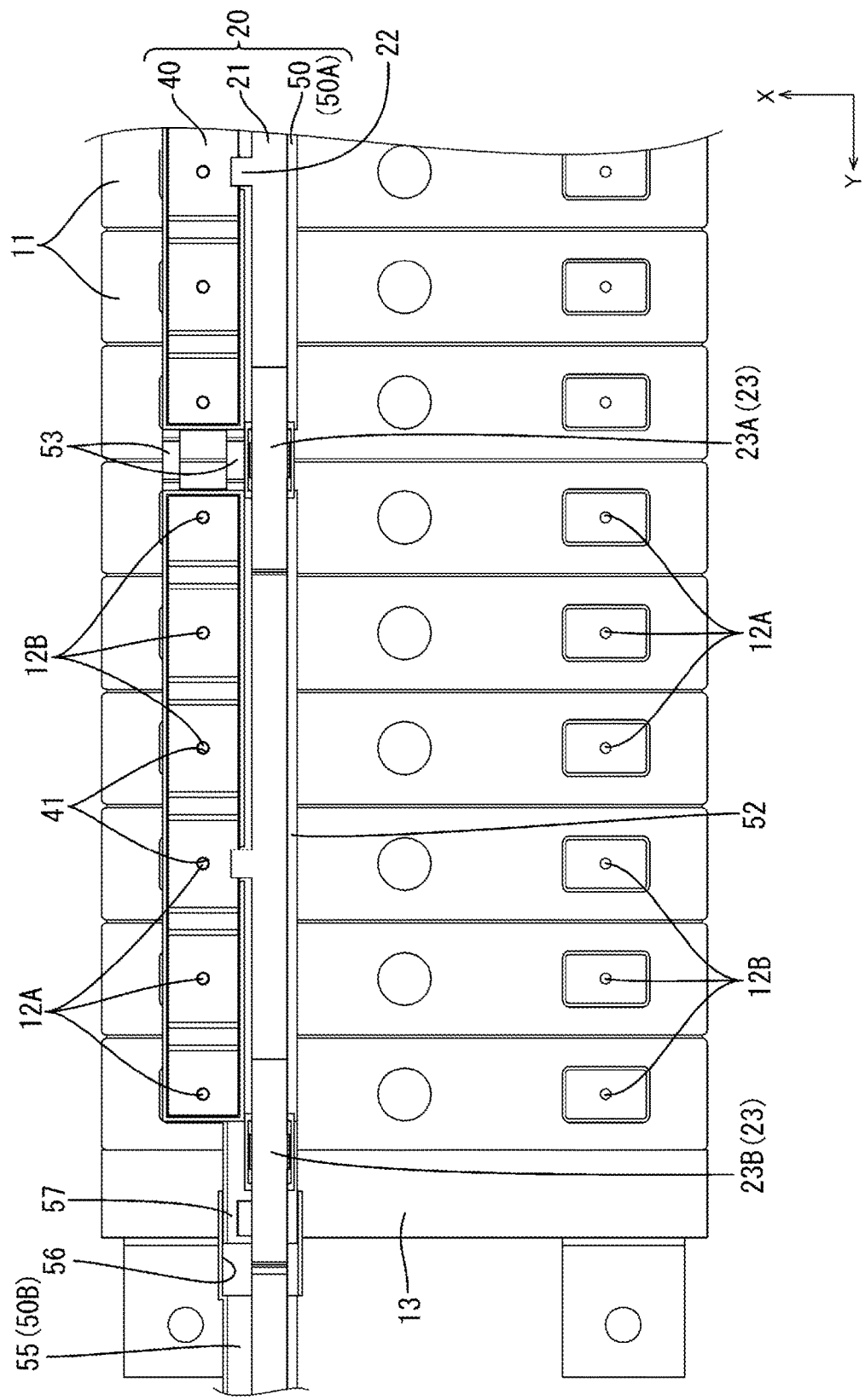
FIG. 3 is an enlarged plan view of a main part of the power storage module.

As shown in FIG. 2, the plurality of power storage elements 11 are divided into two groups, each including 18 power storage elements 11, and the two groups are disposed spaced apart in the left-right direction. The 18 power storage elements 11 in each group are stacked in the left-right direction, and are sandwiched between end plates 13 from the left end and the right end thereof. Fixing portions 14 are provided on a side surface of each of the end plates 13 that is on the opposite side to the power storage elements 11. Although not illustrated, the plurality of power storage elements 11 are fixed to the inside of the power storage pack 2 by the fixing portions 14. As shown in FIG. 3, each power storage element 11 is shaped as a flattened rectangular parallelepiped that houses a power storage element (not illustrated), and has positive and negative electrode terminals 12A and 12B provided on the upper surface thereof.

In-Vehicle Wiring Module

As shown in FIG. 2, the in-vehicle wiring module 20 includes a flexible substrate 21, a busbar 40 that is connected to the flexible substrate 21, and a protector 50 that holds the flexible substrate 21 and the busbar 40. As shown in FIG. 3, the in-vehicle wiring module 20 is attached to the electrode terminals 12A and 12B on the front side of the plurality of power storage elements 11. Note that an in-vehicle wiring module that is attached to the electrode terminals 12A and 12B on the rear side of the plurality of power storage elements 11 has a configuration that is substantially the same as that of the in-vehicle wiring module 20, and thus illustration and description thereof are omitted.

Flexible Substrate

The flexible substrate 21 is a flexible sheet-like substrate, and has a shape that is elongated in the left-right direction, as shown in FIG. 2. Although not illustrated, the flexible substrate 21 includes a base film made of an insulative synthetic resin, and a conductive path routed on the base film. In addition, the base film and the conductive path are covered by an insulating layer formed of an insulating overlay film, a coating film, or the like. Polyimide (PI), polyethylene terephthalate (PET), or the like is used as the material for the base film or the insulating layer. The conductive path is made of a metal such as copper or a copper alloy and is conductive.

As shown in FIG. 3, the flexible substrate 21 includes a busbar connecting portion 22 that protrudes toward the busbar 40. A land that is provided at an end portion of the conductive path is formed (not illustrated) on the lower surface of the busbar connecting portion 22, and the land and the busbar 40 are electrically connected to each other through soldering or the like. The conductive path is connected to a connector (not illustrated) provided at an end portion of the flexible substrate 21, and this connector is connected to the PCU 3.

Folded-Over Structure, First Folded-Over Structure, and Second Folded-Over Structure As shown in FIG. 3, a plurality of folded partial structures are provided on the flexible substrate 21, and are defined as folded-over structures 23. The plurality of folded-over structures 23 include a first folded-over structure 23A (an example of a folded-over structure, see FIG. 5) and a second folded-over structure 23B (an example of a folded-over structure, see FIG. 9) that have different shapes. The first folded-over structure 23A is disposed on the rear side of a flexible portion 53 of the protector 50, which will be described later. The second folded-over structure 23B is disposed at a left end portion of the 18 power storage elements 11 disposed on the right side. As shown in FIG. 2, the flexible substrate 21 includes four first folded-over structures 23A and one second folded-over structure 23B.

Protrusions in First Folded-Over Structure

Figure 6:
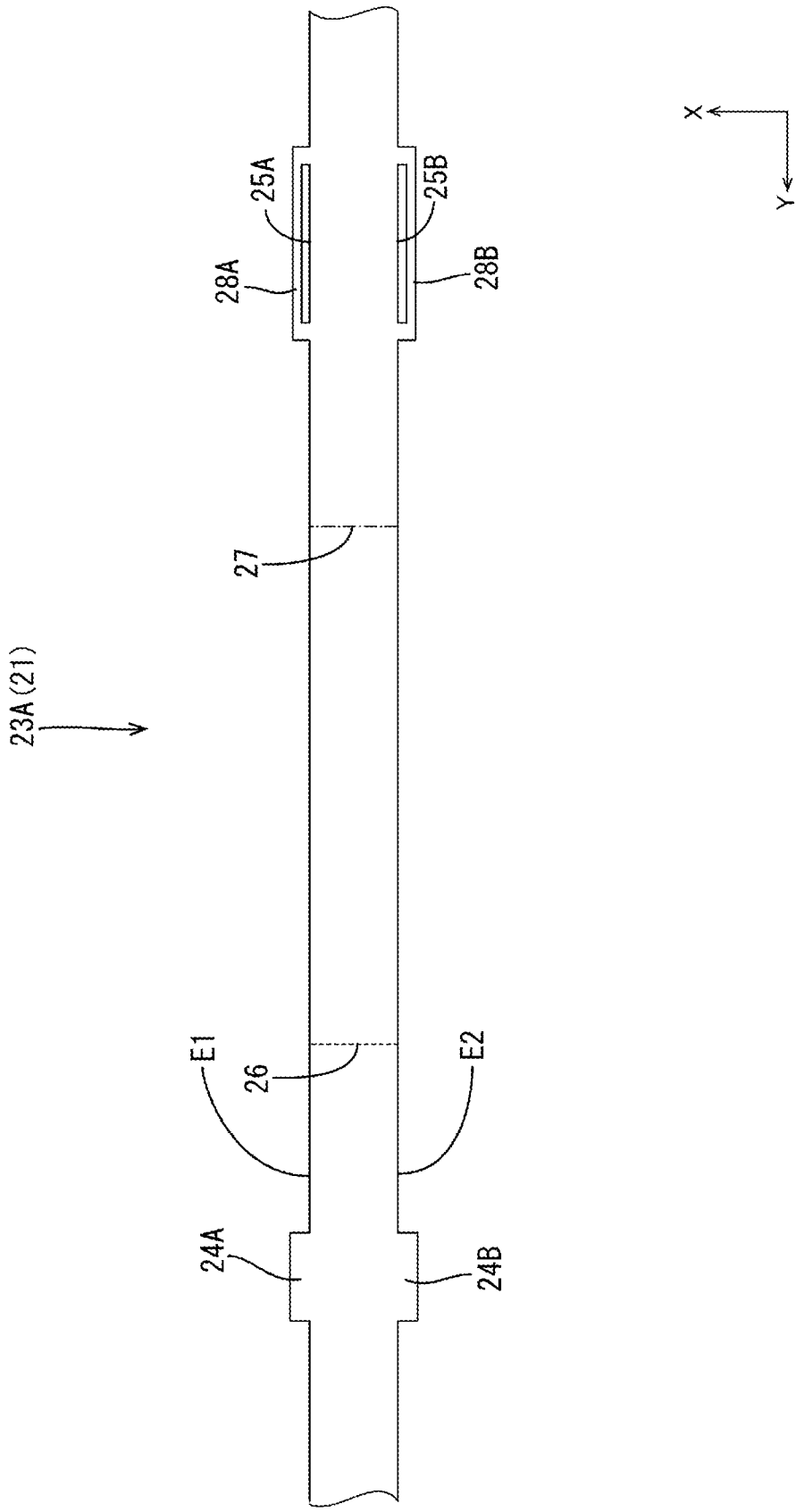
FIG. 6 is a plan view showing an expanded state of the first folded-over structure of the flexible substrate.

FIG. 6 shows an expanded state of the first folded-over structures 23A before being formed by folding the flexible substrate 21. As shown in FIG. 6, each first folded-over structure 23A includes a pair of protrusions 24A and 24B, a pair of slits 25A and 25B, and a pair of folding portions 26 and 27 disposed between the protrusions 24A and 24B and the slits 25A and 25B. The protrusion 24A protrudes forward from an outer edge E1 of the flexible substrate 21, and the protrusion 24B protrudes rearward from an outer edge E2 of the flexible substrate 21. The pair of protrusions 24A and 24B are disposed at the same position in the left-right direction. The protrusion 24A is disposed on the front side of the flexible substrate 21, and the protrusion 24B is disposed on the rear side of the flexible substrate 21.

Slits in First Folded-Over Structure

As shown in FIG. 6, the pair of slits 25A and 25B extend through the flexible substrate 21 in the up-down direction, and have a shape that is elongated in the left-right direction. The pair of slits 25A and 25B are disposed at the same position in the left-right direction. The slit 25A is disposed on the front side of the flexible substrate 21, and the slit 25B is disposed on the rear side of the flexible substrate 21. A front portion of a hole edge portion of the slit 25A is defined as a receiving portion 28A, and a rear portion of a hole edge portion of the slit 25B is defined as a receiving portion 28B.

Folding Portions in First Folded-Over Structure

Figure 7:
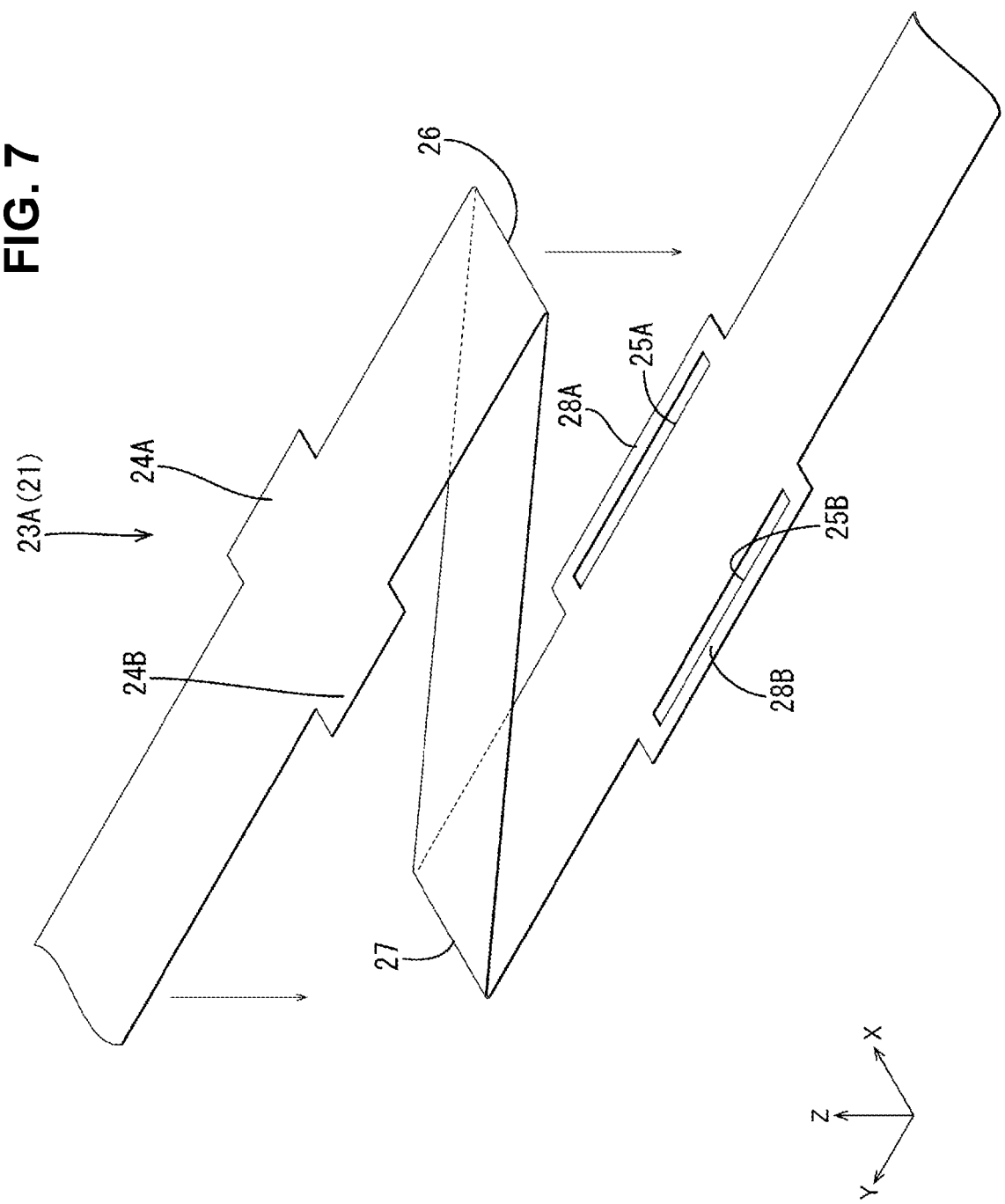
FIG. 7 is a perspective view showing a process for forming the first folded-over structure of the flexible substrate.

As shown in FIG. 6, the folding portion 26 is provided on the protrusion 24A and 24B side, and the folding portion 27 is provided on the slit 25A and 25B side. The creases of the folding portions 26 and 27 extend in the front-and-rear direction. As shown in FIG. 7, the flexible substrate 21 is mountain-folded along the folding portion 26, and is valley-folded along the folding portion 27. Here, mountain folding refers to folding the flexible substrate 21 such that a crease is disposed on the outer side of the folded flexible substrate 21, and valley folding refers to folding the flexible substrate 21 such that the crease is disposed on the inner side of the folded flexible substrate 21. The flexible substrate 21 is folded along the folding portions 26 and 27 such that a portion that includes the protrusions 24A and 24B is disposed on the upper side.

Figure 5:
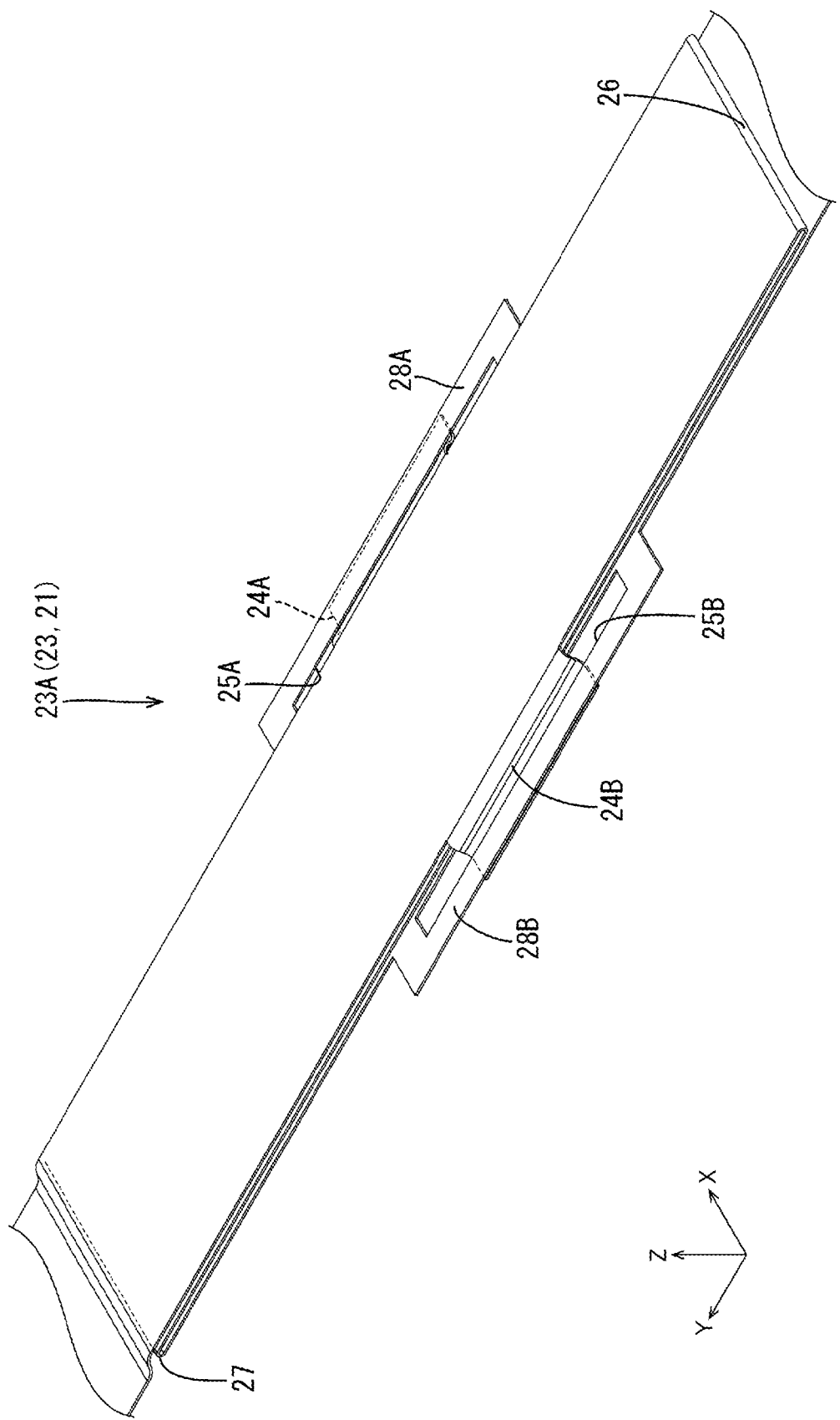
FIG. 5 is a perspective view of a first folded-over structure of a flexible substrate.
Figure 8:
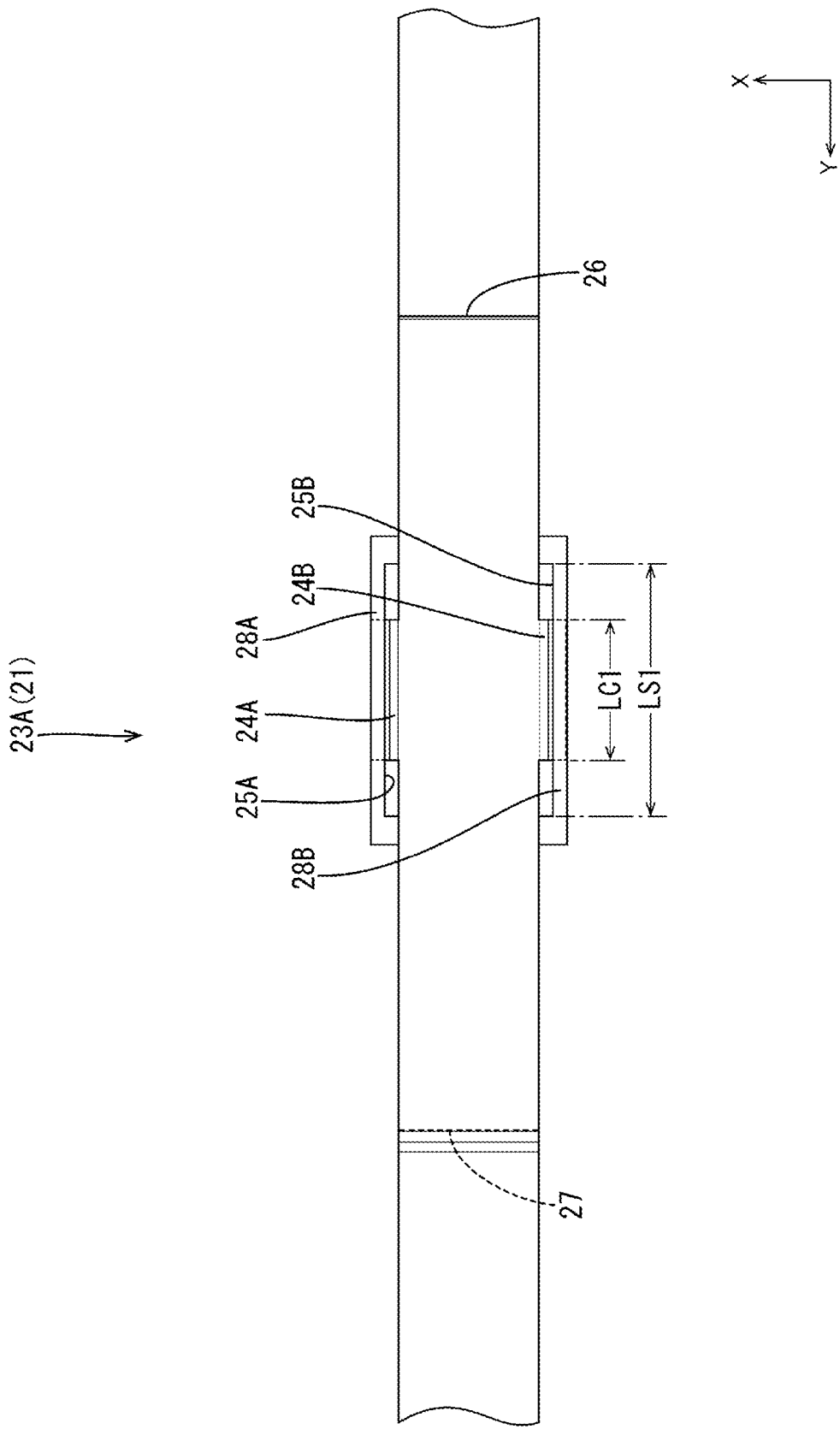
FIG. 8 is a plan view of the first folded-over structure of the flexible substrate.

As shown in FIGS. 5 and 8, the protrusion 24A is disposed at a central portion in the left-right direction of the slit 25A, and is inserted into the slit 25A from above. A leading end portion of the protrusion 24A inserted into the slit 25A is disposed below the receiving portion 28A. In a similar manner, the protrusion 24B is inserted into the slit 25B, and is disposed below the receiving portion 28B. A reaction force for returning to the expanded state from the folded state acts on the folding portions 26 and 27, but the protrusions 24A and 24B are inserted into the slits 25A and 25B and caught on the receiving portions 28A and 28B, and thus the flexible substrate 21 is kept from deforming so as to return to the expanded state (see FIG. 6) from the state of being folded along the folding portions 26 and 27 (see FIGS. 5 and 8).

As shown in FIG. 8, a length LS1 in the left-right direction of the slits 25A and 25B is set to be larger than a length LC1 in the left-right direction of the protrusions 24A and 24B. Accordingly the protrusions 24A and 24B are slidable in the left-right direction in a state of being inserted into the slits 25A and 25B, and thus, the first folded-over structure 23A is configured to be extendable in the left-right direction.

Length Portions

Figure 10:
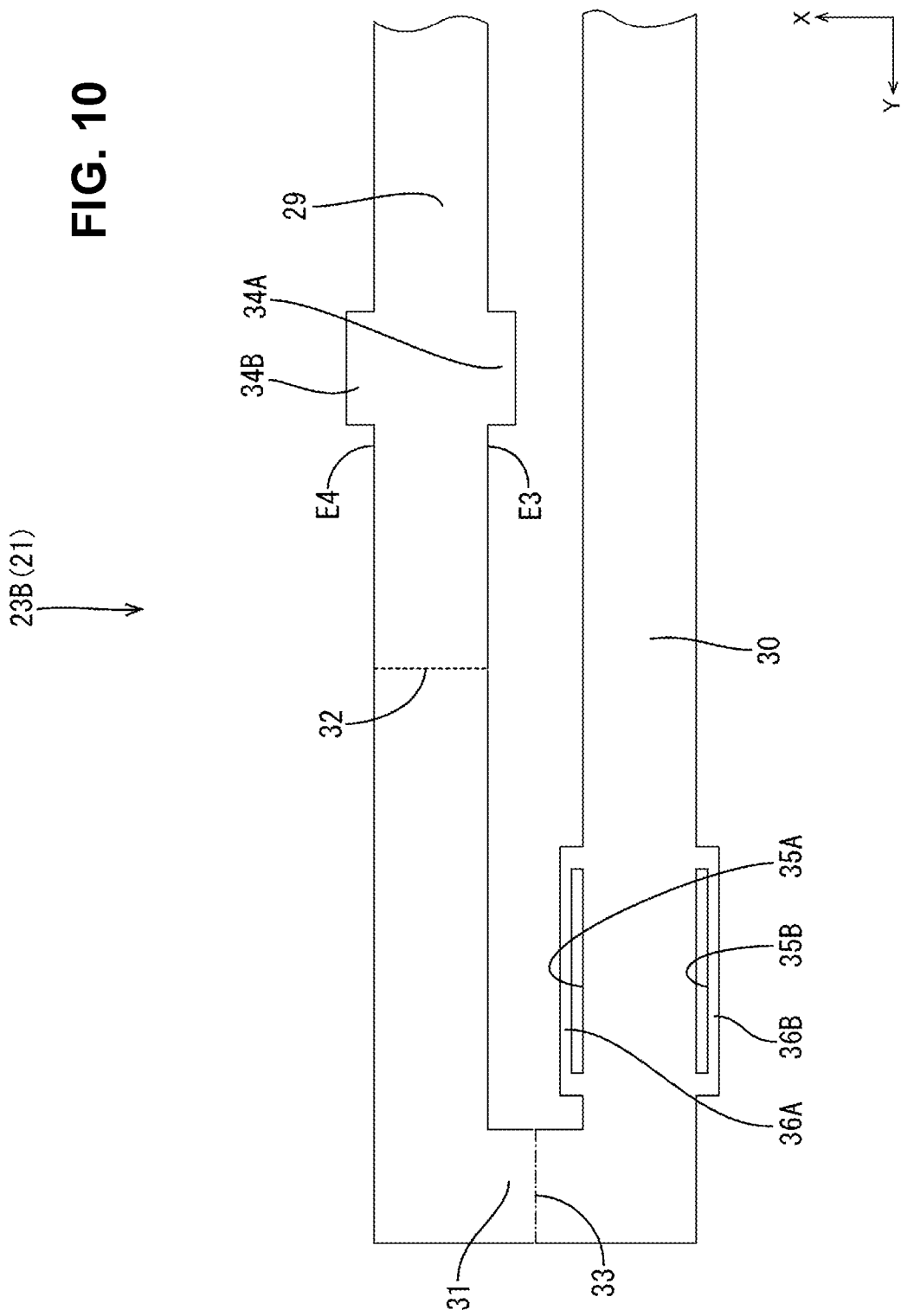
FIG. 10 is a plan view showing an expanded state of the second folded-over structure of the flexible substrate.

FIG. 10 shows the expanded state of the second folded-over structure 23B before being formed by folding the flexible substrate 21. As shown in FIG. 10, the second folded-over structure 23B includes a pair of length portions 29 and 30 extending in parallel in the left-right direction in the expanded state, a coupling portion 31 for coupling the pair of length portions 29 and 30, and a pair of folding portions 32 and 33. A pair of protrusions 34A and 34B are provided on the length portion 29. A pair of slits 35A and 35B are provided on the length portion 30.

Protrusions in Second Folded-Over Structure

Figure 9:
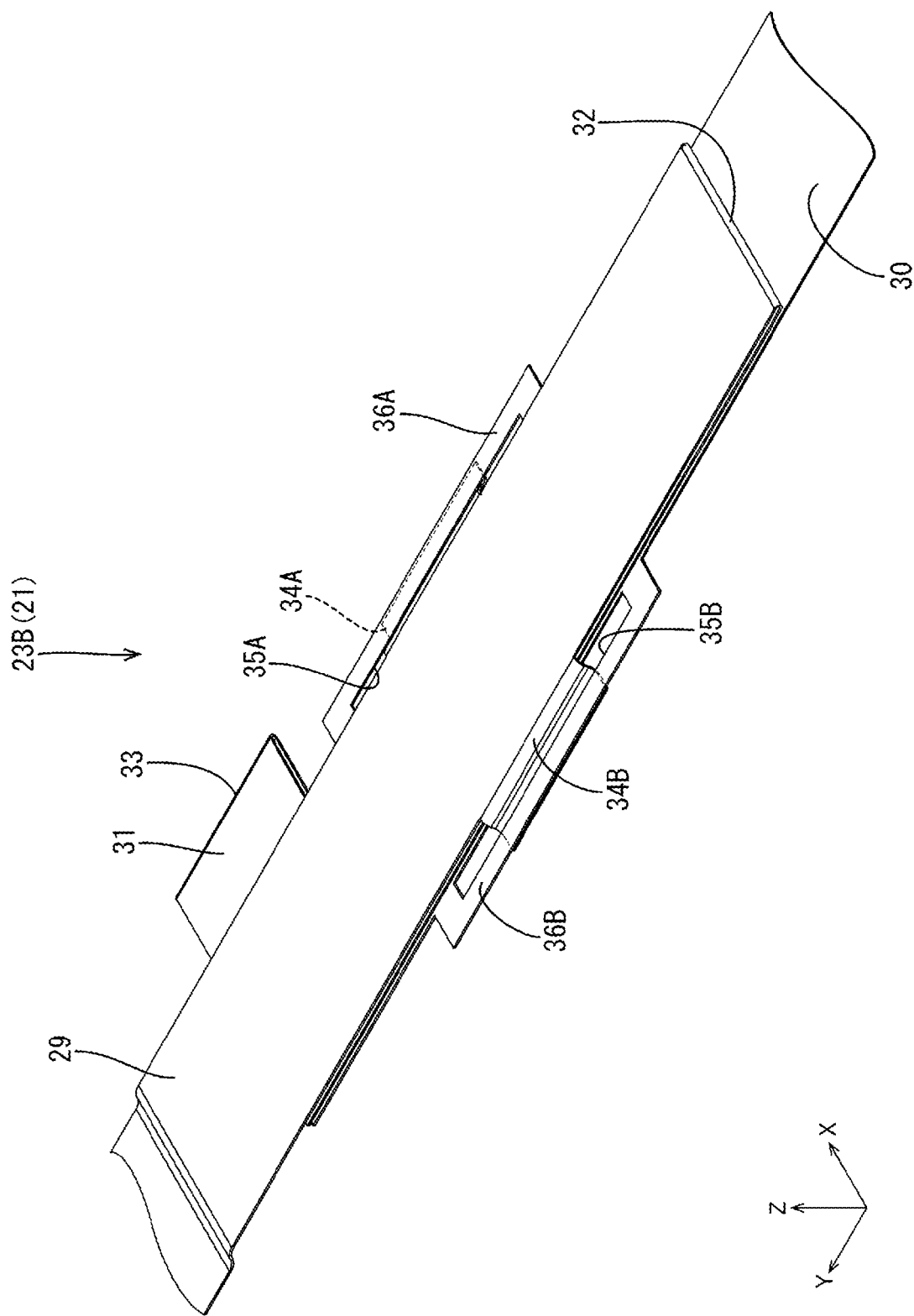
FIG. 9 is a perspective view of a second folded-over structure of the flexible substrate.

As shown in FIG. 10, the protrusion 34A protrudes rearward from an outer edge E3 of the flexible substrate 21, and the protrusion 34B protrudes forward from an outer edge E4 of the flexible substrate 21. The pair of protrusions 34A and 34B are disposed at the same position in the left-right direction. The protrusion 34A is disposed on the rear side of the length portion 29, and the protrusion 34B is disposed on the front side of the length portion 29. Note that, in the folded second folded-over structure 23B, the front side and the rear side of the length portion 29 are reversed, and thus, as shown in FIGS. 9 and 12, the protrusion 34A is disposed on the front side of the flexible substrate 21, and the protrusion 34B is disposed on the rear side of the flexible substrate 21.

Slits in Second Folded-Over Structure

As shown in FIG. 10, the pair of slits 35A and 35B are formed so as to extend through the flexible substrate 21 (the length portion 30) in the up-down direction, and have a shape that is elongated in the left-right direction. The pair of slits 35A and 35B are disposed at the same position in the left-right direction. The slit 35A is disposed on the front side of the length portion 30, and the slit 35B is disposed on the rear side of the length portion 30. A front portion of the hole edge portion of the slit 35A is a receiving portion 36A, and a rear portion of the hole edge portion of the slit 35B is a receiving portion 36B.

Folding Portions in First Folded-Over Structure

As shown in FIG. 10, the pair of folding portions 32 and 33 are disposed between the protrusions 34A and 34B and the slits 35A and 35B. The folding portion 32 is provided in the length portion 29, and the folding portion 33 is provided in the coupling portion 31. The crease of the folding portion 32 extends in the front-and-rear direction. The crease of the folding portion 33 extends in the left-right direction. That is to say, the creases of the pair of folding portions 32 and 33 are disposed perpendicular to each other.

Figure 11:
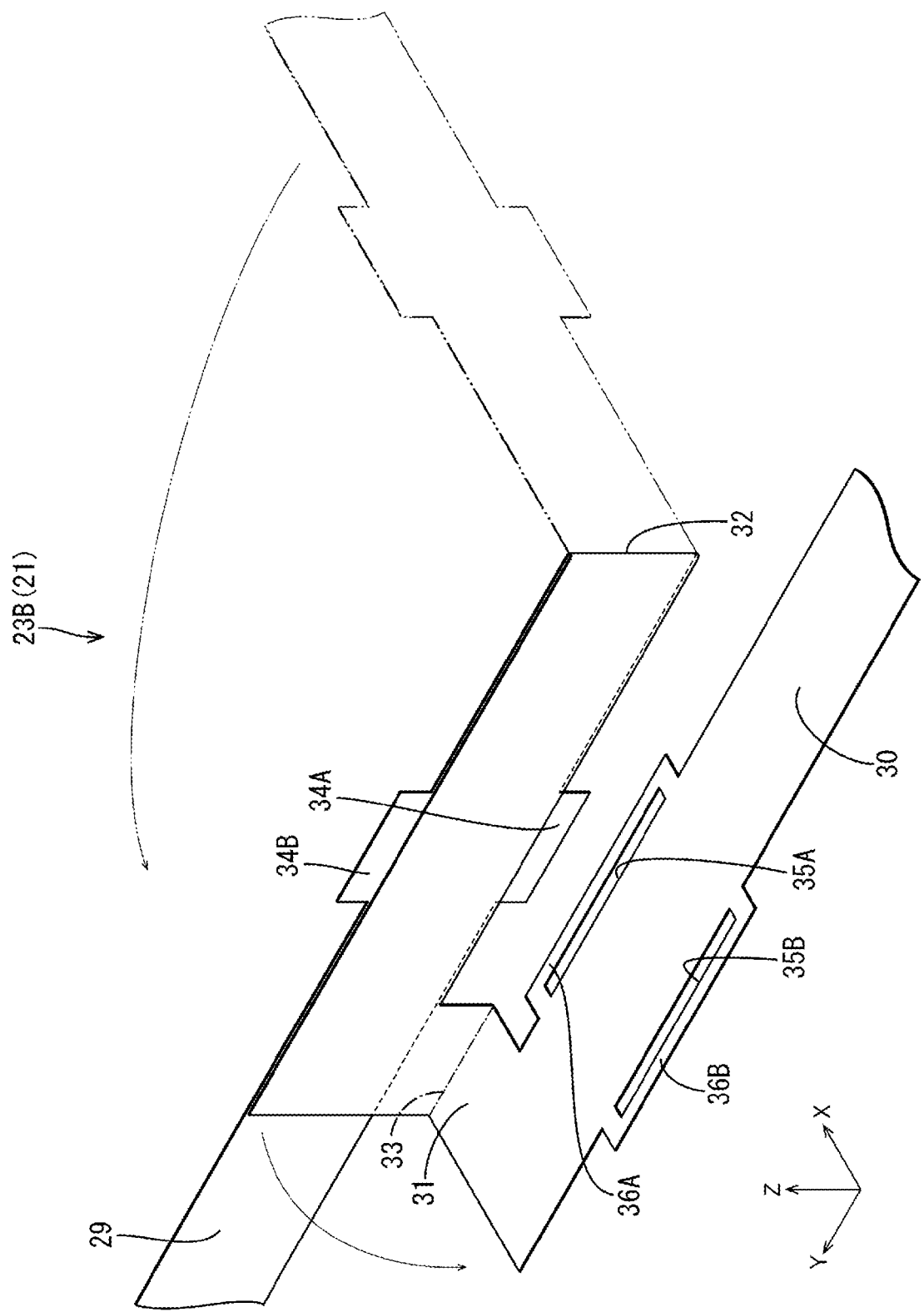
FIG. 11 is a perspective view showing a process for forming the second folded-over structure of the flexible substrate.

As shown in FIG. 11, the flexible substrate 21 is mountain-folded along the folding portion 32, and is valley-folded along the folding portion 33. The flexible substrate 21 is folded along the folding portions 32 and 33 such that the length portion 29 is disposed on the upper side. As shown in FIGS. 9 and 12, in the flexible substrate 21 folded along the folding portions 32 and 33, the pair of length portions 29 and 30 are disposed at the same position in the short side direction of the flexible substrate 21 (in other words, the front-and-rear direction) that is orthogonal to the left-right direction, and are thereby aligned on the same line extending in the left-right direction.

As shown in FIGS. 9 and 12, the protrusion 34A is disposed at the central portion in the left-right direction of the slit 35A, and is inserted into the slit 35A from above. A leading end portion of the protrusion 34A inserted into the slit 35A is disposed below the receiving portion 36A. In a similar manner, the protrusion 34B is inserted into the slit 35B, and is disposed below the receiving portion 36B. A reaction force for returning to the expanded state from the folded state acts on the folding portions 32 and 33, but the protrusions 34A and 34B are inserted into the slits 35A and 35B, and are caught on the receiving portions 36A and 36B, and thus the flexible substrate 21 is kept from deforming so as to return to the expanded state (see FIG. 10) from the state of being folded along the folding portions 32 and 33 (see FIGS. 9 and 12).

As shown in FIG. 12, a length LS2 in the left-right direction of the slits 35A and 35B is set to be larger than a length LC2 in the left-right direction of the protrusions 34A and 34B. Accordingly the protrusions 34A and 34B are slidable in the left-right direction in a state of being inserted into the slits 35A and 35B, and, therefore, the second folded-over structure 23B is configured to be extendable in the left-right direction.

In the second folded-over structure 23B, in the expanded state shown in FIG. 10, the pair of length portions 29 and 30 extend toward the right side from the coupling portion 31. That is to say, the coupling portion 31 is disposed at a left end portion of the flexible substrate 21. On the other hand, in the state of being folded along the folding portions 32 and 33 shown in FIG. 12, the length portion 29 extends toward the left side, and the length portion 30 extends toward the right side. That is to say, at the left end portion of the flexible substrate 21, the length portion 29 extends to the left side past the coupling portion 31. Therefore, by forming the second folded-over structure 23B, the flexible substrate 21 in the folded state (see FIG. 12) can be provided so as to be longer in the left-right direction than the flexible substrate 21 in the expanded state (see FIG. 10). For this reason, the flexible substrate 21 that has the second folded-over structure 23B can be easily applied to the in-vehicle wiring module 20 that is formed to be elongated in the stacking direction of the power storage elements 11. In the present embodiment, as shown in FIG. 2, the second folded-over structure 23B is positioned in the vicinity of the central portion in the left-right direction of the in-vehicle wiring module 20, and the flexible substrate 21 folded in the second folded-over structure 23B is about twice as long as that in the expanded state.

Busbar

As shown in FIG. 3, the busbar 40 is a member for connecting, in parallel, three power storage elements 11 of each group, and is formed by a conductive metal plate member. Examples of a metal that makes up the busbar 40 include copper, a copper alloy aluminum, an aluminum alloy, stainless steel (SUS), and the like. The busbar 40 is shaped as a rectangular plate as a whole, and includes six electrode insertion holes 41 into which the electrode terminals 12A and 12B can be inserted. The busbar 40 and the electrode terminals 12A and 12B are electrically connected to each other through soldering. The busbar 40 is electrically connected to the busbar connecting portion 22 of the flexible substrate 21 through soldering or the like.

As shown in FIG. 3, the protector 50 is made of an insulative synthetic resin, and is shaped as a plate. The protector 50 is constituted by two members, and includes a first protector 50A disposed on the right side of the in-vehicle wiring module 20, and a second protector 50B disposed on the left side of the in-vehicle wiring module 20. The first protector 50A and the second protector 50B have substantially the same configuration, and thus the first protector 50A will be described below in detail as a configuration that is common to the first protector 50A and the second protector 50B.

Figure 4:
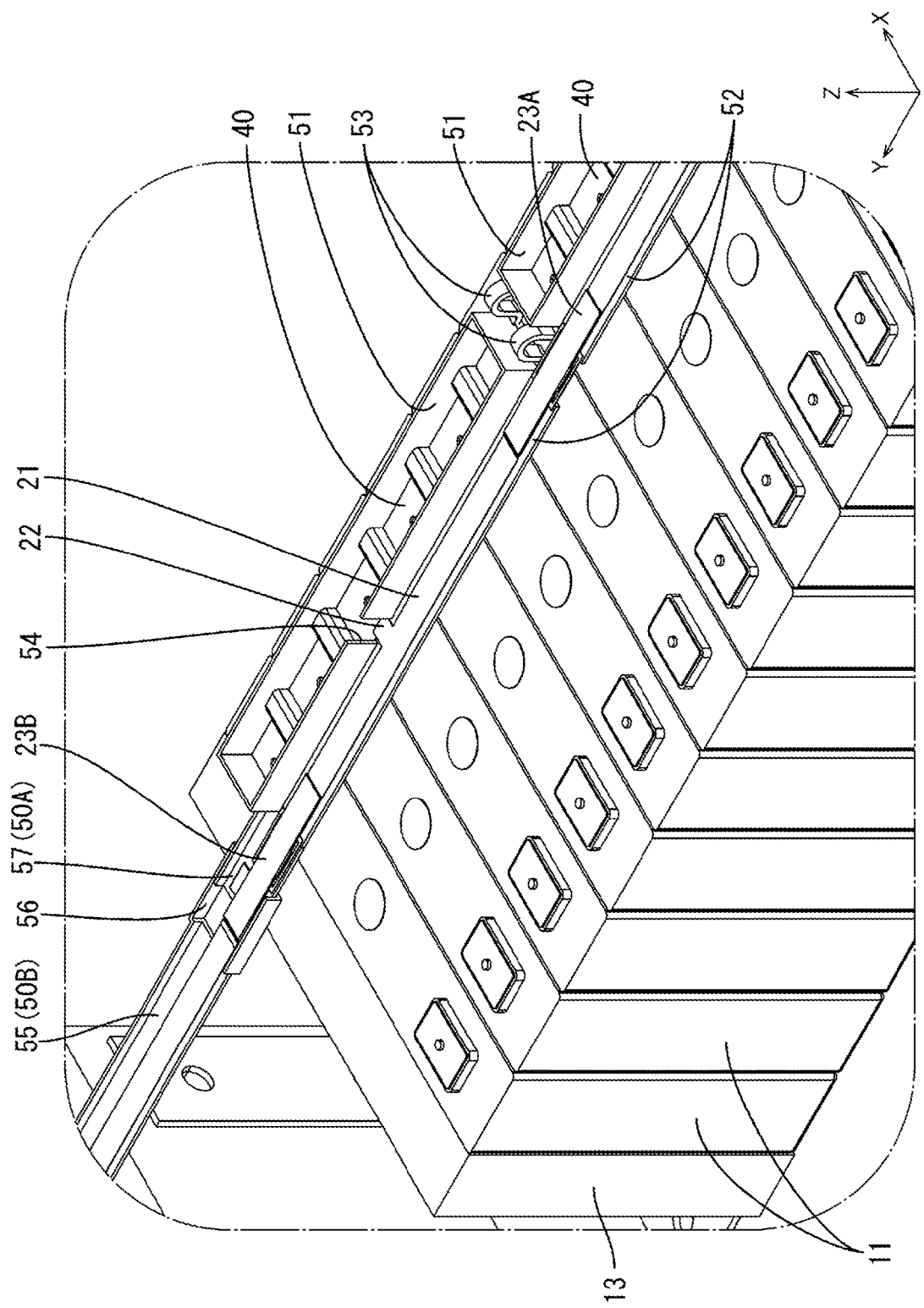
FIG. 4 is an enlarged perspective view of a main part of the power storage module.

As shown in FIG. 4, the first protector 50A includes busbar routing portions 51 that are provided on a front end portion thereof, and in which busbars 40 are respectively disposed, and wiring plate portions 52 that are respectively provided continuous with the rear side of the busbar routing portions 51, and on which the flexible substrate 21 is placed. Each busbar routing portion 51 is shaped as a bottomless frame, and is formed so as to separate busbars 40 aligned in the left-right direction from each other. The busbar routing portion 51 includes an engaging claw portion or the like (not illustrated), and is configured so as to be able to hold the busbar 40. The flexible portion 53 that can be deflected and deformed in the left-right direction is provided between busbar routing portions 51. By providing the flexible portion 53, it is possible to absorb manufacturing tolerance in the left-right direction of the power storage elements 11, the busbars 40, and the like, assembly tolerance between the busbars 40 and the plurality of power storage elements 11, and the like. A notch portion 54 in which the busbar connecting portion 22 of the flexible substrate 21 is disposed is provided in the rear wall of the busbar routing portion 51.

As shown in FIG. 4, the wiring plate portions 52 extend in the left-right direction, and are formed in a plate shape. The wiring plate portion 52 is provided continuous with the rear side of the busbar routing portion 51, and is not provided on the rear side of the flexible portion 53. The flexible substrate 21 is placed on the wiring plate portions 52. The flexible substrate 21 includes portions fixed to the wiring plate portions 52 using an adhesive, adhesive tape, or the like, and is disposed to be extendable in the left-right direction at the first folded-over structures 23A and the second folded-over structure 23B. Each first folded-over structure 23A is disposed between wiring plate portions 52 on the front side of the flexible portion 53, and the flexible substrate 21 can follow dimensional changes in the left-right direction caused by deflection of the flexible portion 53.

As shown in FIGS. 3 and 4, a bridging portion 55 is provided at the right end portion of the second protector 50B. The bridging portion 55 extends to the upper side of the left end plate 13 attached to the 18 power storage elements 11 on the left side. A guide recessed portion 56 having a groove-like shape is formed on the right side of the bridging portion 55. A guide plate portion 57 extending toward the left side is provided on the wiring plate portion 52 at the left end of the first protector 50A. The guide plate portion 57 and the guide recessed portion 56 are engaged with each other so as to be slidable in the left-right direction. Accordingly, it is possible to absorb assembly tolerance in the left-right direction of the first protector 50A, the second protector 50B, and the plurality of power storage elements 11, and the like. The second folded-over structure 23B is disposed in the vicinity of the guide plate portion 57, and the flexible substrate 21 can follow dimensional changes in the left-right direction due to engagement between the first protector 50A and the second protector 50B.

Actions and Effects of Embodiment

According to the embodiment, the following operations and effects are achieved.

The in-vehicle wiring module 20 according to an embodiment of the present disclosure is the in-vehicle wiring module 20 that is attached to the plurality of power storage elements 11 that include the electrode terminals 12A and 12B, and includes the busbar 40 that is connected to the electrode terminals 12A and 12B, and the flexible substrate 21 that is electrically connected to the busbar 40, the flexible substrate 21 having the first folded-over structures 23A folded along the folding portions 26 and 27, and the second folded-over structure 23B folded along the folding portions 32 and 33. Each first folded-over structure 23A includes the protrusions 24A and 24B that protrude from the outer edges E1 and E2 of the flexible substrate 21 in the expanded state before the flexible substrate 21 is folded along the folding portions 26 and 27, and the slits 25A and 25B into which the protrusions 24A and 24B are inserted, and the folding portions 26 and 27 are disposed between the protrusions 24A and 24B and the slits 25A and 25B in the flexible substrate 21 in the expanded state, and, as a result of the protrusions 24A and 24B being inserted into the slits 25A and 25B, the flexible substrate 21 is kept from deforming so as to return to the expanded state from the state of being folded at the folding portions 26 and 27. The second folded-over structure 23B includes the protrusions 34A and 34B that respectively protrude from the outer edges E3 and E4 of the flexible substrate 21 in the expanded state before the flexible substrate 21 is folded along the folding portions 32 and 33, and the slits 35A and 35B into which the protrusions 34A and 34B are inserted, and the folding portions 32 and 33 are disposed between the protrusions 34A and 34B and the slits 35A and 35B in the flexible substrate 21 in the expanded state, and as a result of the protrusions 34A and 34B being inserted into the slits 35A and 35B, the flexible substrate 21 is kept from deforming so as to return to the expanded state from the state of being folded along the folding portions 32 and 33.

According to the above configuration, the flexible substrate 21 folded along the folding portions 26, 27, 32, and 33 can be kept from deforming so as to return to the expanded state, and thus the in-vehicle wiring module 20 can be easily attached.

In the embodiment, a pair of protrusions 24A and 24B and a pair of slits 25A and 25B are provided in one first folded-over structure 23A, and a pair of protrusions 34A and 34B and a pair of slits 35A and 35B are provided in one second folded-over structure 23B.

According to the above configuration, the flexible substrate 21 folded along the folding portions 26, 27, 32, and 33 can be further effectively kept from deforming so as to return to the expanded state.

In the embodiment, the flexible substrate 21 has a shape that is elongated in the left-right direction, and the second folded-over structure 23B includes the pair of length portions 29 and 30 extending in parallel in the left-right direction in the expanded state, the coupling portion 31 for coupling the pair of length portions 29 and 30, and the pair of folding portions 32 and 33, the protrusions 34A and 34B are provided on the length portion 29, the slits 35A and 35B are provided in the length portion 30, and the creases of the pair of folding portions 32 and 33 in the second folded-over structure 23B are disposed perpendicular to each other.

According to the above configuration, the length in the left-right direction of the flexible substrate 21 folded along the folding portions 32 and 33 can be made larger than the length in the left-right direction of the flexible substrate 21 in the expanded state. For this reason, for example, even when a large number of power storage elements 11 are stacked in the left-right direction, the in-vehicle wiring module 20 can be easily manufactured.

In the embodiment, the pair of length portions 29 and 30 are disposed at the same position in the short-side direction of the flexible substrate 21 that is orthogonal to the left-right direction, and are thereby aligned on the same line extending in the left-right direction.

According to the above configuration, since the pair of length portions 29 and 30 are aligned on the same line extending in the left-right direction, the flexible substrate 21 can be formed in an elongated shape. For this reason, it is possible to reduce the length of the in-vehicle wiring module 20 in the short-side direction of the flexible substrate 21.

In the embodiment, the flexible substrate 21 has a shape that is elongated in the left-right direction, and the slits 25A, 25B, 35A, and 35B are formed to be elongated in the left-right direction, and the length LS1 in the left-right direction of the slits 25A and 25B is set larger than the length LC1 in the left-right direction of protrusions 24A and 24B, and the length LS2 in the left-right direction of the slits 35A and 35B is set larger than the length LC2 in the left-right direction of the protrusions 34A and 34B.

According to the above-described configuration, the protrusions 24A and 24B are slidable in the left-right direction in a state of being inserted into the slits 25A and 25B, and the protrusions 34A and 34B are slidable in the left-right direction in a state of being inserted into the slits 35A and 35B, and thus it is possible to absorb manufacturing tolerance in the left-right direction of the power storage elements 11, the busbars 40, and the like and assembly tolerance between the in-vehicle wiring module 20 and the plurality of power storage elements 11.

In addition, the flexible substrate 21 according to the embodiment is the flexible substrate 21 that is incorporated into the in-vehicle wiring module 20 in the state of being folded along the folding portions 26, 27, 32, and 33. The flexible substrate 21 includes the protrusions 24A and 24B that respectively protrude from the outer edges E1 and E2 of the flexible substrate 21 in the expanded state before being folded along the folding portions 26 and 27, and the slits 25A and 25B into which protrusions 24A and 24B are inserted, the folding portions 26 and 27 are disposed between the protrusions 24A and 24B and the slits 25A and 25B in the expanded state, and, as a result of the protrusions 24A and 24B being inserted into the slits 25A and 25B, the flexible substrate 21 is kept from deforming so as to return to the expanded state from the state of being folded along the folding portions 26 and 27. In addition, the flexible substrate 21 includes the protrusions 34A and 34B that respectively protrude from the outer edges E3 and E4 of the flexible substrate 21 in the expanded state before being folded along the folding portions 32 and 33, and the slits 35A and 35B into which the protrusions 34A and 34B are inserted, and the folding portions 32 and 33 are disposed between the protrusions 34A and 34B and the slits 35A and 35B in the expanded state, and as a result of the protrusions 34A and 34B being inserted into the slits 35A and 35B, the flexible substrate 21 is kept from deforming so as to return to the expanded state from the state of being folded along the folding portions 32 and 33.

According to the above configuration, the flexible substrate 21 folded along the folding portions 26, 27, 32, and 33 can be kept from deforming so as to return to the expanded state, and thus the flexible substrate 21 is less likely to deform during transportation and the like.

OTHER EMBODIMENTS (1) In the above embodiment, a configuration is adopted in which the first folded-over structures 23A and the second folded-over structure 23B are extendable in the left-right direction, and the second folded-over structure 23B extends the flexible substrate 21 in the left-right direction, but there is no limitation thereto, and the folded-over structures do not need to be extendable, and do not need to extend the flexible substrate. That is to say, it suffices for a configuration to be adopted in which a folded-over structure includes a protrusion, a slit into which the protrusion is inserted, and a folding portion disposed between the protrusion and the slit, and the flexible substrate is kept from deforming so as to return to an expanded state from a state of being folded along the folding portion, and no other configuration or function need be provided.

(2) In the above embodiment, a configuration is adopted in which the flexible substrate 21 includes four first folded-over structures 23A and one second folded-over structure 23B, but there is no limitation thereto, and any number of folded-over structures may be included in the flexible substrate.

(3) In the above embodiment, a configuration is adopted in which each first folded-over structure 23A includes the pair of protrusions 24A and 24B, the pair of slits 25A and 25B, and the pair of folding portions 26 and 27, and the second folded-over structure 23B includes the pair of protrusions 34A and 34B, the pair of slits 35A and 35B, and the pair of folding portions 32 and 33, but there is no limitation thereto, and any numbers of protrusions, slits, and folding portions may be included in a folded-over structure.

(4) In the above embodiment, a configuration is adopted in which the in-vehicle wiring module 20 includes the protector 50 constituted by two members, namely the first protector 50A and the second protector 50B, but there is no limitation thereto. The in-vehicle wiring module does not include a protector, and may include a protector constituted by three or more members.

(5) In the above embodiment, a configuration is adopted in which the in-vehicle wiring module 20 is attached to two power storage element groups, each of which is constituted by 18 power storage elements 11 that are stacked, but there is no limitation thereto, and the in-vehicle wiring module may be attached to any number of power storage element groups, and each power storage element group may be constituted by any number of power storage elements.

LIST OF REFERENCE NUMERALS

1 Vehicle
2 Power storage pack
3 PCU
4 Wire harness
10 Power storage module
11 Power storage element
12A, 12B Electrode terminal
13 End plate
14 Fixing portion
20 In-vehicle wiring module
21 Flexible substrate
22 Busbar connecting portion
23 Folded-over structure
23A First folded-over structure
23B Second folded-over structure
24A, 24B, 34A, 34B Protrusion
25A, 25B, 35A, 35B Slit
26, 27, 32, 33 Folding portion
28A, 28B, 36A, 36B Receiving portion
29, 30 Length portion
31 Coupling portion
40 Busbar
41 Electrode insertion hole
50 Protector
50A First protector
50B Second protector
51 Busbar routing portion
52 Wiring plate portion
53 Flexible portion
54 Notch portion
55 Bridging portion
56 Guide recessed portion
57 Guide plate portion
E1, E2, E3, E4 Outer edge of flexible substrate
LC1, LC2 Length in left-right direction of protrusion
LS1, LS2 Length in left-right direction of slit

The invention claimed is:
1. An in-vehicle wiring module that is to be attached to a plurality of power storage elements that include electrode terminals, the in-vehicle wiring module comprising:
 a busbar that is connected to the electrode terminals; and
 a flexible substrate that is electrically connected to the busbar,
 wherein the flexible substrate has a folded-over structure where the flexible substrate is folded along a folding portion,
 the folded-over structure includes a protrusion that protrudes from an outer edge of the flexible substrate in an expanded state before the flexible substrate is folded along the folding portion, and a slit into which the protrusion is to be inserted, the folding portion is disposed between the protrusion and the slit of the flexible substrate in the expanded state, and as a result of the protrusion being inserted into the slit, the flexible substrate is kept from deforming so as to return to the expanded state from a state of being folded along the folding portion.

2. The in-vehicle wiring module according to claim 1, wherein
one folded-over structure is provided with a pair of protrusions and a pair of slits.

3. The in-vehicle wiring module according to claim 2, wherein
the flexible substrate has a shape that is elongated in a first direction,
the folded-over structure includes a pair of length portions that extend in parallel in the first direction in the expanded state, a coupling portion for coupling the pair of length portions, and a pair of folding portions,
the protrusions are provided on one of the pair of length portions,
the slits are provided on the other of the pair of length portions, and
creases of the pair of folding portions of the folded-over structure are disposed perpendicular to each other.

4. The in-vehicle wiring module according to claim 3, wherein
the pair of length portions are disposed at the same position in a short-side direction of the flexible substrate that is orthogonal to the first direction, and are aligned on the same line extending in the first direction.

5. The in-vehicle wiring module according to claim 1, wherein
the flexible substrate has a shape that is elongated in a first direction,
the slit is formed to be elongated in the first direction, and
a length in the first direction of the slit is larger than a length in the first direction of the protrusion.

6. A flexible substrate that is to be incorporated in an in-vehicle wiring module in a state of being folded along a folding portion, the flexible substrate comprising:
a protrusion that protrudes from an outer edge of the flexible substrate in an expanded state before the flexible substrate is folded along the folding portion; and a slit into which the protrusion is to be inserted,
wherein the folding portion is disposed between the protrusion and the slit in the expanded state, and
as a result of the protrusion being inserted into the slit, the flexible substrate is kept from deforming so as to return to the expanded state from the state of being folded along the folding portion.

\* \* \* \* \*